(12) United States Patent
Kim et al.

(10) Patent No.: US 9,751,096 B2
(45) Date of Patent: Sep. 5, 2017

(54) DISPENSER AND METHOD OF FABRICATING ORGANIC LIGHT EMITTING DISPLAY DEVICE USING THE SAME

(71) Applicant: LG DISPLAY CO., LTD., Seoul (KR)

(72) Inventors: Min-Ju Kim, Paju-si (KR);
Seung-Hyun Lee, Goyang-si (KR);
Yong-Woo Yoo, Paju-si (KR);
Sang-Hyun Bae, Seo-gu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/992,727

(22) Filed: Jan. 11, 2016

(65) Prior Publication Data

US 2016/0121346 A1    May 5, 2016

Related U.S. Application Data

(62) Division of application No. 14/102,961, filed on Dec. 11, 2013, now Pat. No. 9,263,699.

(30) Foreign Application Priority Data

Dec. 13, 2012 (KR) .......................... 10-2012-0145599

(51) Int. Cl.
*B05B 1/30* (2006.01)
*H01L 51/52* (2006.01)
*H01L 51/00* (2006.01)

(52) U.S. Cl.
CPC ............ *B05B 1/30* (2013.01); *H01L 51/5253* (2013.01); *H01L 51/5256* (2013.01); *H01L 51/0005* (2013.01)

(58) Field of Classification Search
CPC ... B05B 1/30; H01L 51/5256; H01L 51/5253; H01L 51/0005
See application file for complete search history.

(56) References Cited

U.S. PATENT DOCUMENTS

| | | |
|---|---|---|
| 2004/0031977 A1 | 2/2004 | Brown et al. |
| 2004/0081759 A1* | 4/2004 | Maruyama ............ B05C 5/0216 427/256 |
| 2004/0217202 A1* | 11/2004 | Hynes ....................... B05B 1/02 239/380 |
| 2005/0084214 A1 | 4/2005 | Hayashi et al. |
| 2010/0265289 A1 | 10/2010 | Chung et al. |
| 2010/0298738 A1* | 11/2010 | Felts ........................ B05D 1/62 600/576 |
| 2011/0134188 A1 | 6/2011 | Arakawa |
| 2011/0292136 A1 | 12/2011 | Kurebayashi et al. |

* cited by examiner

*Primary Examiner* — Kyoung Lee
(74) *Attorney, Agent, or Firm* — Brinks Gilson & Lione

(57) ABSTRACT

A dispenser capable of forming a uniform material layer and a method of fabricating an organic light emitting display device using the same are disclosed. The dispenser includes a syringe including a coating material and provided with a nozzle for ejecting the coating material to a substrate and a syringe cap for controlling a coating amount from the nozzle, a pressing unit providing a pressure for ejecting the coating material, a transporting unit for moving the syringe above, and a cap-driving unit for driving the syringe cap to control the coating amount.

6 Claims, 10 Drawing Sheets

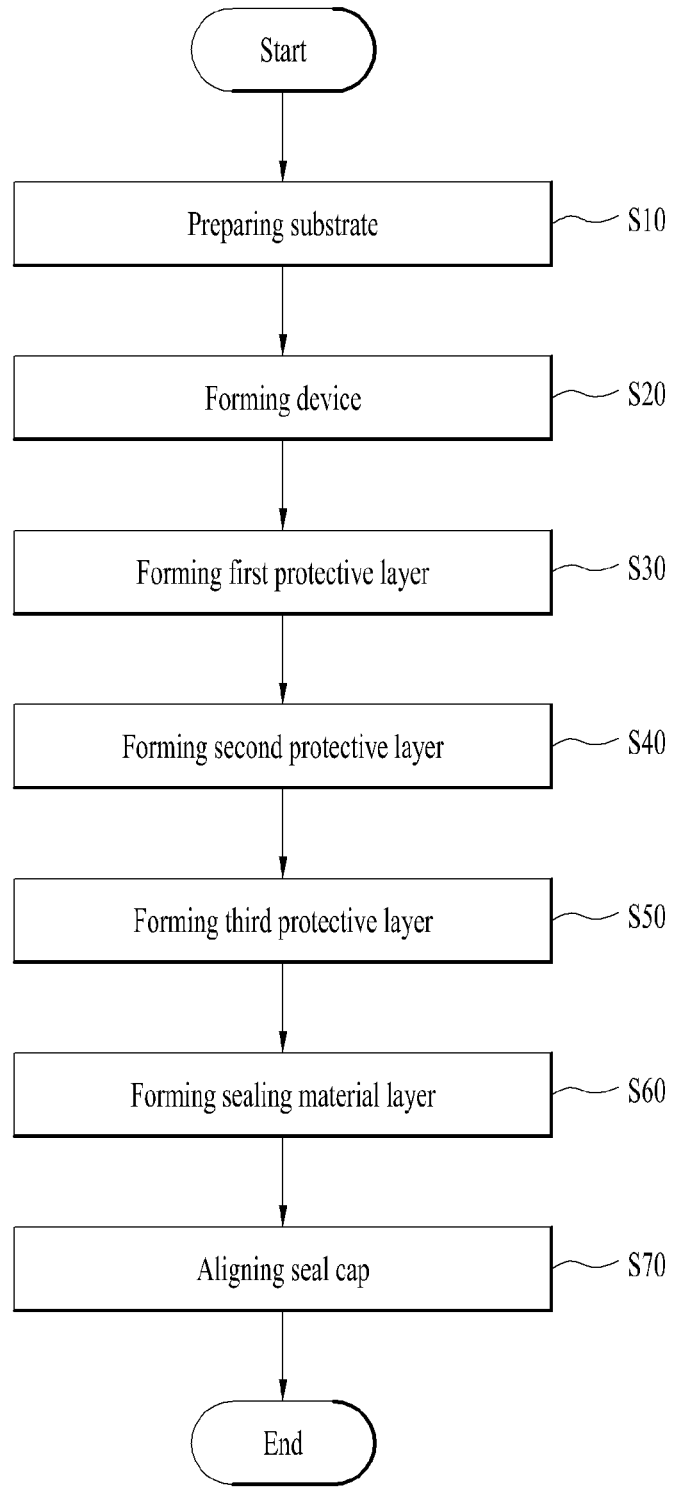

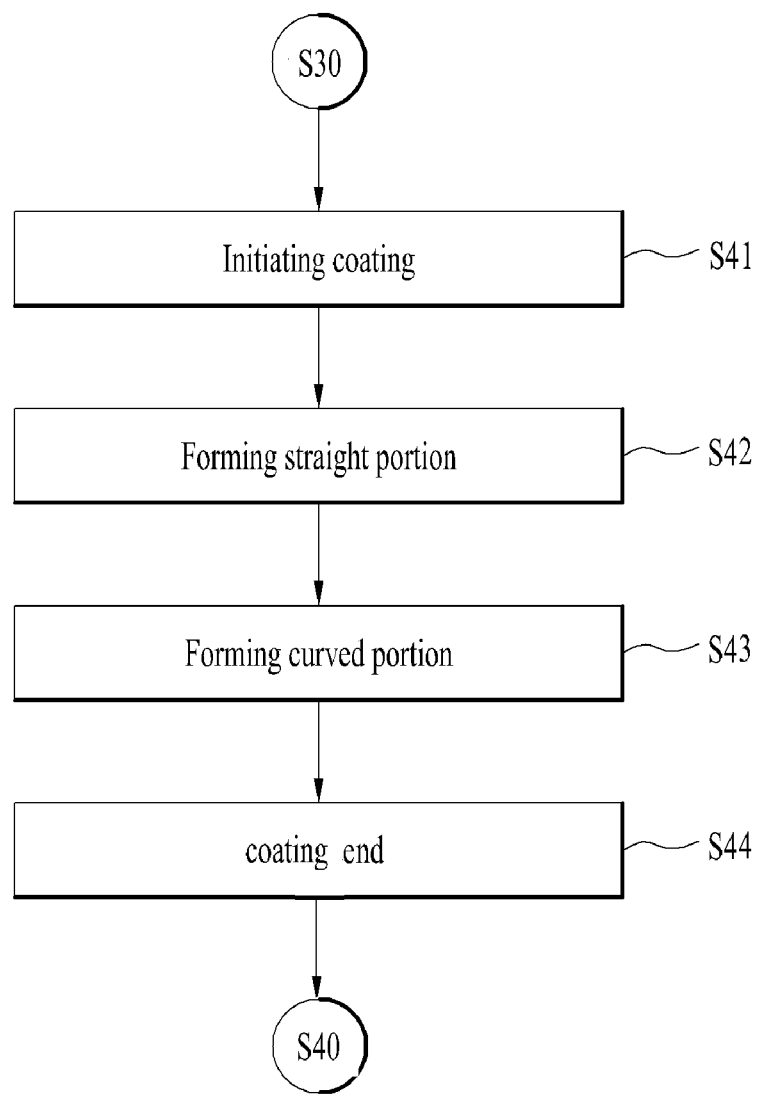

DISPENSER AND METHOD OF FABRICATING ORGANIC LIGHT EMITTING DISPLAY DEVICE USING THE SAME

The present patent document is a divisional of U.S. patent application Ser. No. 14/102,961 filed on Dec. 11, 2013, which claims priority to the Korean Patent Application No. 10-2012-0145599, filed on Dec. 13, 2012, which is hereby incorporated by reference as if fully set forth herein.

BACKGROUND

Field of the Disclosure

The present disclosure relates to a dispenser and a method of fabricating an organic light emitting display device using the same, and more particularly, to a dispenser capable of forming a uniform material layer and a method of fabricating an organic light emitting display device using the same.

Discussion of the Related Art

Organic light emitting display devices are important for their potential application to flexible displays due to slim design, low power consumption, and high image quality thereof compared to other flat panel display devices. An organic light emitting display device may include an organic light emitting device formed by laminating an anode, an organic light emitting layer, and a cathode on a substrate and an encapsulation unit covering the organic light emitting device by capping.

Organic light emitting display devices readily deteriorate not only by internal factors, such as oxygen that causes deterioration of electrodes and light emitting layers and interfacial reaction between the light emitting layers, but also by external factors, such as moisture, oxygen, and UV light infiltration, resulting in performance degradation and malfunction. Accordingly, encapsulation of organic light emitting display devices is important to protect the organic light emitting devices from external moisture, oxygen, and UV light.

To this end, encapsulation is applied to organic light emitting display devices by forming a plurality of inorganic protective layers, and interposing an organic layer between the inorganic protective layers. By use of encapsulation, infiltration of external moisture and oxygen into organic light emitting display devices is prevented.

A dispenser is often used to form a relatively thick organic layer during encapsulation of organic light emitting display devices. The dispenser is used to coat an organic material used to form the organic layer in the organic light emitting display devices through an injector having a nozzle. Dispensers have been widely used to form organic layers since desired thickness and width of the organic layers may be efficiently obtained by continuous coating at a constant rate.

However, the thickness of the organic layer may not be uniform or coating may not be uniformly performed using conventional dispensers at a start point and an end point of the organic layer, and portions where the direction of the dispenser is changed. Furthermore, such coating defects may cause cracks during subsequent processes, resulting in defects.

SUMMARY

A dispenser includes a syringe including a nozzle for ejecting the coating material to a substrate and a syringe cap for controlling a coating amount from the nozzle to which a coating material is injected, a pressing unit providing a pressure for ejecting the coating material, a transporting unit for moving the syringe above the substrate, and a cap-driving unit for driving the syringe cap to control the coating amount.

In another aspect, a method of fabricating an organic light emitting display device using a dispenser includes preparing a substrate, forming an organic light emitting device on the substrate, forming a first protective layer on the substrate to cover the organic light emitting device and a portion of the substrate, forming a second protective layer on the first protective layer by coating an organic material, forming a third protective layer on the first protective layer and the second protective layer to cover the second protective layer and the first protective layer, forming a sealing material layer on the third protective layer, and aligning a seal cap on the sealing material layer. The forming of the second protective layer may be performed by use of a dispenser including a nozzle and a syringe provided with a syringe cap to control a coating amount of the nozzle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 9 is a flowchart illustrating a method of fabricating the organic light emitting display device according to an embodiment of the present invention; and FIG. 10 is a flowchart illustrating a method of forming the second protective layer in more detail as shown in FIG. 9.

DETAILED DESCRIPTION OF THE EXEMPLARY EMBODIMENTS

Figure 1:
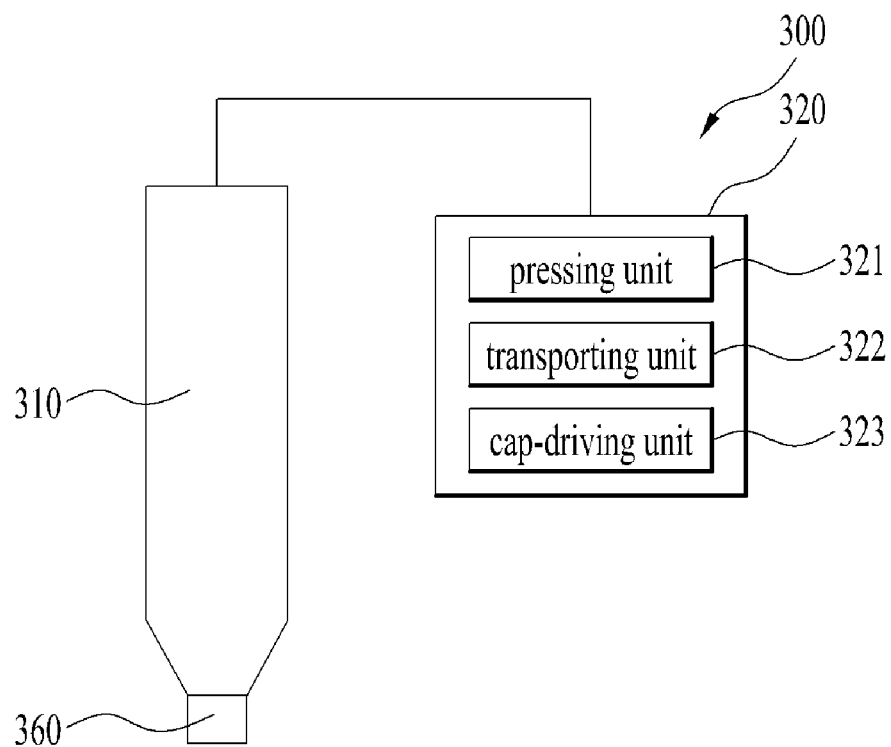
FIG. 1 is a diagram illustrating a structure of a dispenser according to an embodiment of the present invention.
Figure 2:
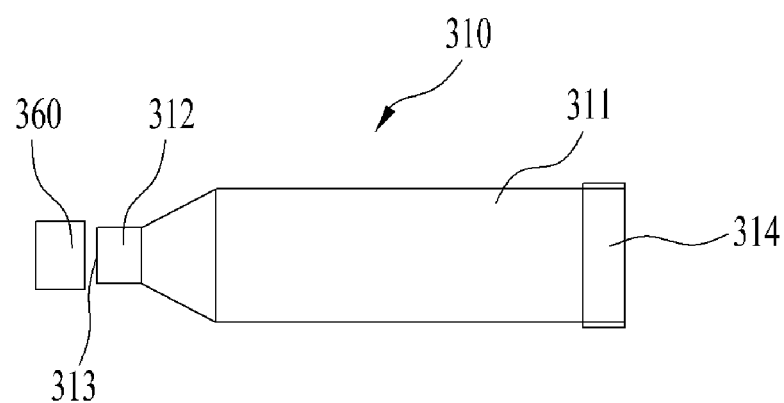
FIG. 2 is a diagram illustrating a syringe of FIG. 1 in more detail.

Reference will now be made in detail to the preferred embodiments of the present invention, examples of which are illustrated in the accompanying drawings. Wherever possible, the same reference numbers will be used throughout the drawings to refer to the same or like parts. Descriptions of technical details known in the art of the present invention and those not directly concerned with the present invention will be omitted to provide a clear understanding of the present invention without obscuring the subject of the present invention. Some features shown in the drawings are expanded, condensed, or simplified for ease of description, and the drawings and components thereof are not necessary illustrated in the appropriate scale. However, those skilled in the art can easily understand the above details FIG. 1 is a diagram illustrating a structure of a dispenser according to the present invention. FIG. 2 is a diagram illustrating a syringe of FIG. 1 in more detail.

Referring to FIGS. 1 and 2, a dispenser according to the present invention includes a syringe 310 and a drive unit 320. The drive unit 320 includes a pressing unit 321, a transporting unit 322, and a cap-driving unit 323.

The syringe 310 functions as an injector applying a coating material to a target object such as a substrate. To this end, the syringe 310 is provided with a raw material, a pressure for ejecting the raw material, a moving force for movement above the target object, and a driving force for controlling an ejection force by the drive unit 320. Particularly, the syringe 310 is formed as a cylinder provided with a nozzle 312 at one end as illustrated in FIG. 2. The syringe 310 includes a body 311 having a hollow cylindrical or polygonal pillar shaped barrel. A coupling unit 314 is disposed at the other end of the syringe 310 opposite to the one end where the nozzle 312 is disposed to be connected to the drive unit 320. A raw material is injected into the syringe 310 via the coupling unit 314, and a pressure for ejecting the raw material is provided through the coupling unit 314.

A nozzle 312 is formed at one end of the syringe 310. Particularly, the syringe 310 according to the present invention has a nozzle surface 313 provided with a plurality of nozzle hole groups (shown below). Each of the nozzle hole groups has at least one nozzle and is used to eject the raw material. Particularly, the nozzle 312 of the syringe 310 is provided with a syringe cap 360 that selectively opens or closes the nozzle hole group according to the driving force provided by the cap-driving unit 323 of the drive unit 320 to control the amount of the raw material ejected therefrom. The nozzle 312 and the syringe cap 360 will be described in more detail below.

The drive unit 320 is connected to the syringe 310 in a fixed state, such that the syringe 310 moves above the target object. In addition, the drive unit 320 supplies the raw material into the syringe 310 and drives the syringe cap 360 in order to control the ejection amount of the nozzle 312. To this end, the drive unit 320 includes the pressing unit 321, the transporting unit 322, and the cap-driving unit 323. Since the drive unit 320 may be configured in various forms, detailed descriptions thereof will not be given. Only functions and structures of the drive unit 320 relevant to the present invention will be described herein. In this regard, the syringe 310 may be stationary and the target object may move, but the present invention is not limited thereto.

The pressing unit 321 provides a pressure such that the raw material may be ejected through the nozzle 312. The pressing unit 321 may include a tube, piston, or screw connected to the coupling unit 314 and may further include a pump or a motor for applying driving force to the tube, piston, or screw. However, the present invention is not limited thereto and the pressure to eject the raw material may be applied in various ways.

The transporting unit 322 moves the syringe 310 above the target object or moves the target object below the syringe 310, such that the raw material is coated over the target object to a desired shape and thickness.

The cap-driving unit 323 provides driving force for rotating the syringe cap 360.

Figure 3A:
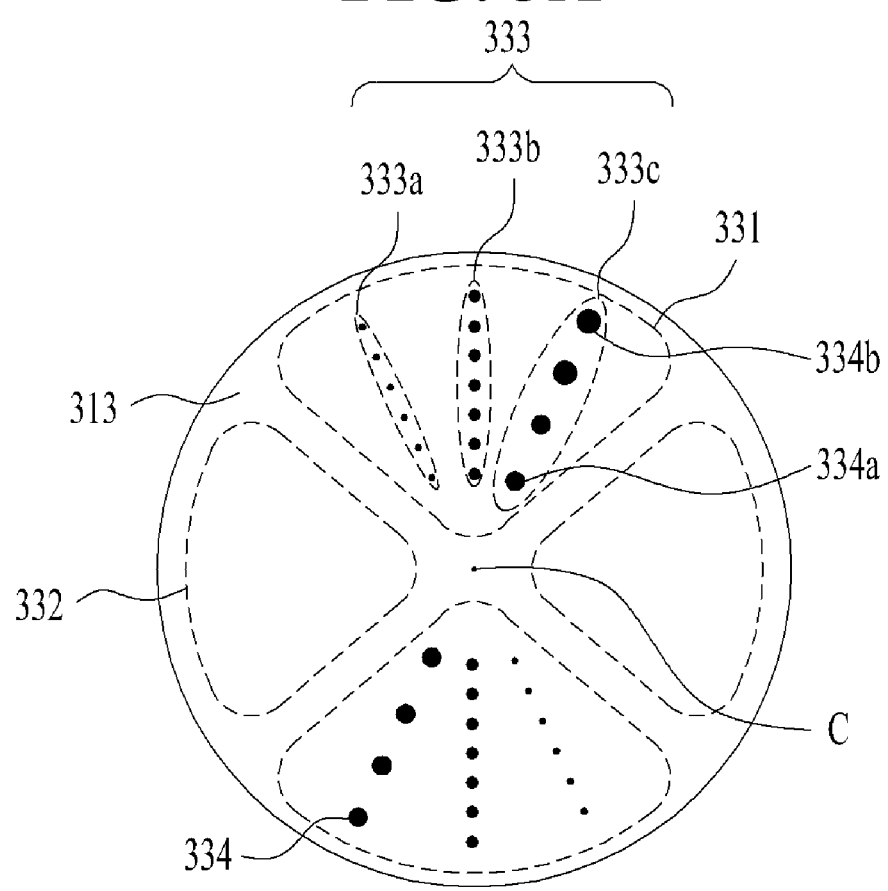
FIGS. 3A to 3C are diagrams illustrating examples of a nozzle surface.
Figure 3B:
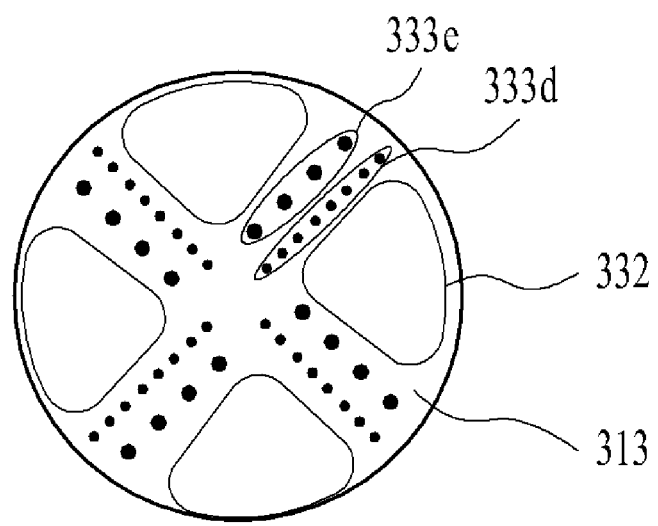
Figure 3C:
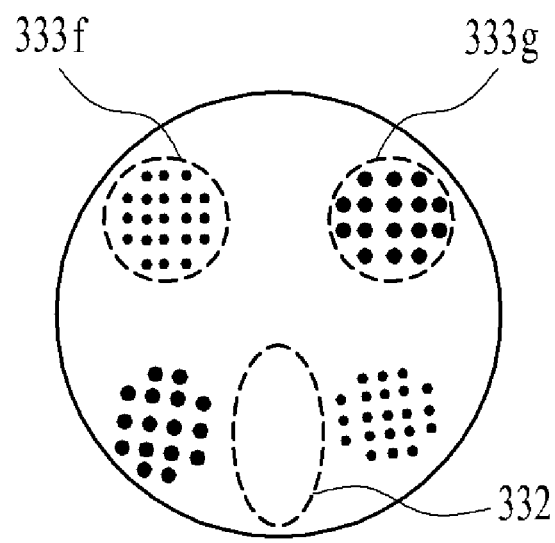

FIGS. 3A to 3C are diagrams illustrating examples of a nozzle surface.

Figure 4A:
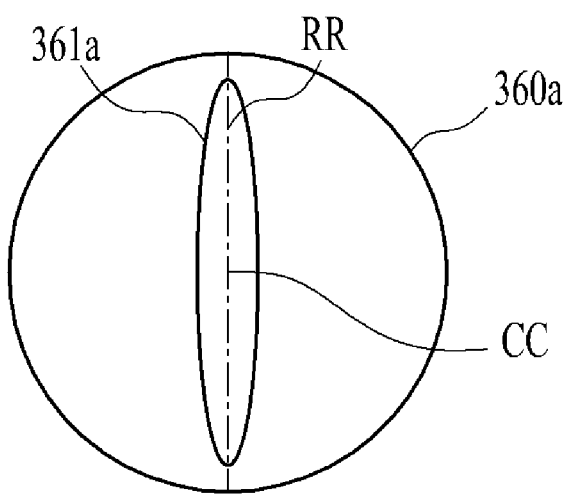
FIGS. 4A to 4C are diagrams illustrating examples of a syringe cap.
Figure 4B:
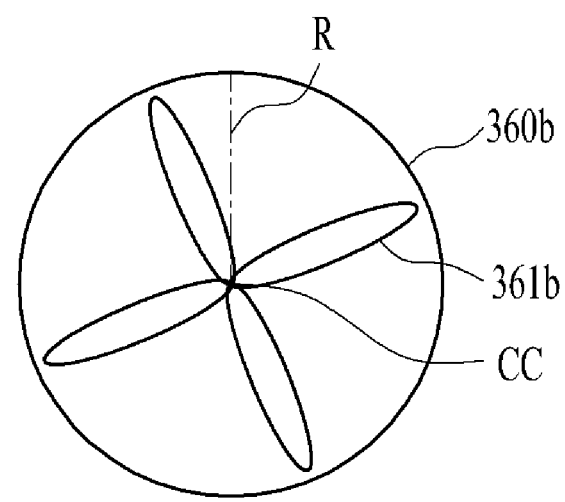
Figure 4C:
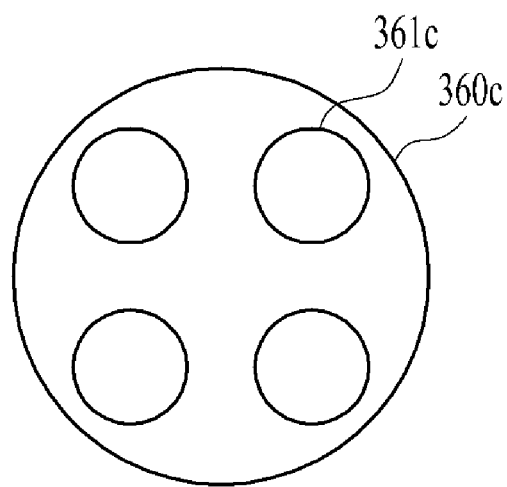

FIGS. 4A to 4C are diagrams illustrating examples of a syringe cap.

Referring to FIGS. 3A to 3C, the nozzle surface 313 has nozzle hole groups 333 (333a to 333c, 333d and 333e, or 333g and 333f) each including at least one nozzle hole 334.

Each of the nozzle hole groups 333 refers to a group including at least one nozzle hole 334 that is opened or closed by the syringe cap 360 (360a, 360b, or 360c) shown in FIGS. 4A to 4C. Particularly, the nozzle hole groups 333 have different numbers, cross-sectional areas, shapes, and average cross-sectional areas of the nozzle holes. Accordingly, the nozzle hole groups 333 eject different amounts of the raw material.

In particular, FIG. 3A illustrates first to third nozzle hole groups 333a to 333c. The first nozzle hole group 333a is a micro nozzle including nozzle holes 334 having a smallest cross-sectional area, i.e., ejecting a smallest amount of the raw material, compared to those of the second nozzle hole group 333b and the third nozzle hole group 333c. In addition, the second nozzle hole group 333b includes nozzle holes 334 having a larger cross-sectional area than the first nozzle hole group 333a and a smaller cross-sectional area than the third nozzle hole group 333c.

Due to such structure as described above, when the first nozzle hole group 333a is opened and the second and third nozzle hole groups 333b and 333c are closed, the ejection amount per unit time decreases even at the same pressure. In the same manner, when the third nozzle hole group 333c is opened and the first and second nozzle hole groups 333a and 333b are closed, the amount of the raw material ejected through the nozzle hole groups 333a and 333b increases.

As such, the nozzle hole groups 333 include different nozzle holes 334 such that the ejection amount of per unit time may vary. Particularly, the nozzle holes 334 belonging to the same nozzle hole group 333 may have different cross-sectional areas or shapes. That is, as in the third nozzle hole group 333c, a nozzle hole 334b disposed closer to the edge of the nozzle hole 334a may have a larger cross-sectional area than a nozzle hole 334a disposed closer to the center C of the nozzle surface 313. However, the present invention is not limited thereto, and various modifications may be applied as long as the nozzle hole groups 333 eject different amount of the raw material.

The nozzle hole groups 333, i.e., the nozzle holes 334, are formed in a first region 331 of the nozzle surface 313. The nozzle surface 313 is divided into the first region 331 and a second region 332 as illustrated in FIG. 3A.

The first region 331 is a region where the nozzle holes 334 are formed, and the second region 332 is a region where the nozzle holes 334 are not formed and is adjacent to the first region 331 as illustrated here.

When one of the open slits 361 (361a to 361c) of the syringe cap 360 as illustrated in FIGS. 4A to 4C is disposed in the first region 331, one of the nozzle hole groups 333 is opened. On the other hand, when one of the open slits 361 is disposed in the second region 332, all of the nozzle hole groups 333 are closed to cease ejection of the raw material.

Referring to FIGS. 4A to 4C, at least one open slit 361 is formed at the syringe cap 360 (360a, 360b, or 360c).

The open slits 361 change the ejection amount of the raw material by opening or closing each of the plurality of nozzle hole groups 333. That is, as described above, when one of the open slits 361 overlaps the first nozzle hole group 333a to open the first nozzle hole group 333a, the second and third nozzle hole groups 333b and 333c are closed, so that a smallest amount of the raw material is ejected therethrough. Particularly, when one of the open slits 361 overlaps the second region 332, all of the first to third nozzle hole groups 333a, 333b, and 333c are closed to cease ejection of the raw material.

To this end, the syringe cap 360 is rotatably coupled to the nozzle 312. Accordingly, the syringe cap 360 may selectively open one of the plurality of nozzle hole groups 333a, 333b, and 333c by rotation or close all of the of nozzle hole groups 333a, 333b, and 333c by overlapping the open slits 361 and the second region.

At least one open slit 361a may be formed along a virtual straight line RR passing through the center C as illustrated in FIG. 4A. At least one open slit 361b may also be radially aligned from the center cc along a radial line R in the syringe cap 360 as illustrated in FIG. 4B. Alternatively, open slits 361c having an oval hole shape or a polygonal hole shape disposed at sides of the syringe cap 360 may be formed as illustrated in FIG. 4C.

These shapes of the open slits 361 depend on the alignment and shape of the nozzle hole groups 333 and may vary as long as the nozzle hole groups 333 may be easily opened and closed.

Referring to FIGS. 3A to 3C, the nozzle holes 334 and the nozzle hole groups 333 (333a to 333c, 333d and 333e, or 333f and 333g) may have various shapes. Referring to FIGS. 4A to 4C, at least one of the open slits 361 (361a to 361c) of the syringe cap 360 may have various shapes.

FIG. 3A illustrates nozzle holes 334 belong to one nozzle hole group and aligned along a secant line (or diametral line) passing through the center c. In the nozzle hole groups 333a, 333b, and 333c illustrated in FIG. 3A, the nozzle holes 334 are formed in a spoke shape. Here, the second region 332 is disposed to be adjacent to the nozzle hole groups 333a, 333b, and 333c. At least one of the nozzle hole groups 333a, 333b, and 333c illustrated in FIG. 3A is opened by the open slit 361a of the syringe cap 360 illustrated in FIG. 4A. For example, when two of the first nozzle hole groups 333a illustrated in FIG. 3A are opened by the open slit 361a of the syringe cap 360a illustrated in FIG. 4A, other nozzle hole groups 333b and 333c are closed by the syringe cap 360a.

FIG. 3B illustrates two different nozzle hole groups 333e and 333d ejecting different amounts. To this end, the nozzle hole group 333d having a smaller ejection amount includes nozzle holes 334 with a smaller diameter, and the nozzle hole group 333e having a larger ejection amount includes nozzle holes 334 with a larger diameter or more nozzle holes 334.

The nozzle holes 334 of the nozzle hole groups 333e and 333d may not be aligned along the secant line passing through the center as illustrated in FIG. 3B. Particularly, the nozzle surface 313 illustrated in FIG. 3B has more second regions 332 between the nozzle holes 334 compared to that illustrated in FIG. 3A. In other words, two second regions are illustrated in FIG. 3A, and four second regions are illustrated in FIG. 3B. At least one of the nozzle hole groups 333d and 333e illustrated in FIG. 3B is opened by the open slit 361b of the syringe cap 360b illustrated in FIG. 4B. For example, when four of the nozzle hole groups 333d illustrated in FIG. 3B are opened by the open slit 361a of the syringe cap 360a illustrated in FIG. 4B, other nozzle hole groups 333e are closed by the syringe cap 360b.

Alternatively, the nozzle hole groups 333f and 333g may be aligned not to be symmetrical to each other about the center of the nozzle surface 313 as illustrated in FIG. 3C.

Particularly, as illustrated in FIG. 3C, two first regions are defined by the nozzle hole groups 333f and 333g, and a second region 332 is defined by the remaining portion of the nozzle surface 313. At least one of the nozzle hole groups 333g and 333f illustrated in FIG. 3C is opened by the open slit 361c of the syringe cap 360c illustrated in FIG. 4C.

As illustrated in FIGS. 3A to 3C, the nozzle holes 334 or the nozzle hole groups 333f and 333g may be configured in various shapes. Various modifications may be made, as long as the nozzle holes 334 are easily opened or closed by the syringe cap 360 through the first region 331 having the nozzle hole groups 333 and the second region 332 not having the nozzle hole groups 333, which are distinguished from each other, and the ejection amount is easily controlled by selecting the nozzle hole group 333. Correspondingly, the shapes of the open slits 361 may also be changed.

Figure 5:
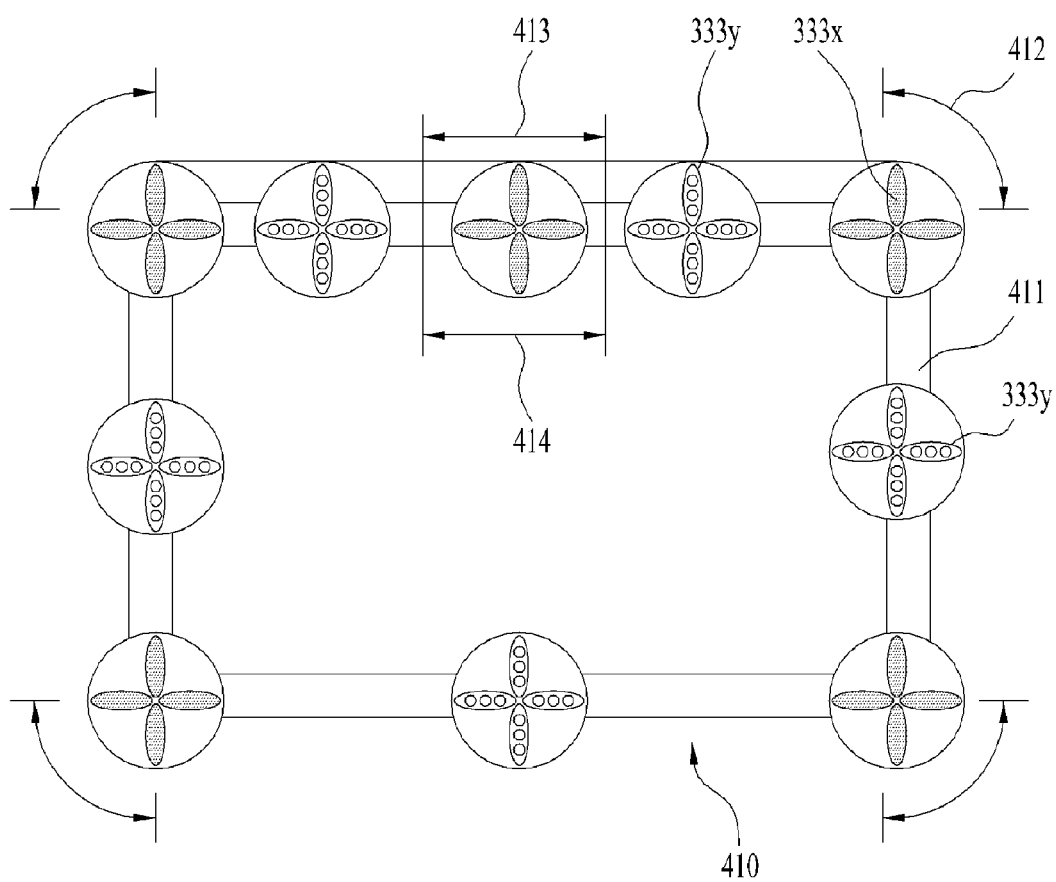
FIG. 5 is a diagram for describing a process of forming a pattern using an embodiment of the dispenser of the present invention.

FIG. 5 is a diagram for describing a process of forming a pattern using the dispenser of the present invention.

Figure 6A:
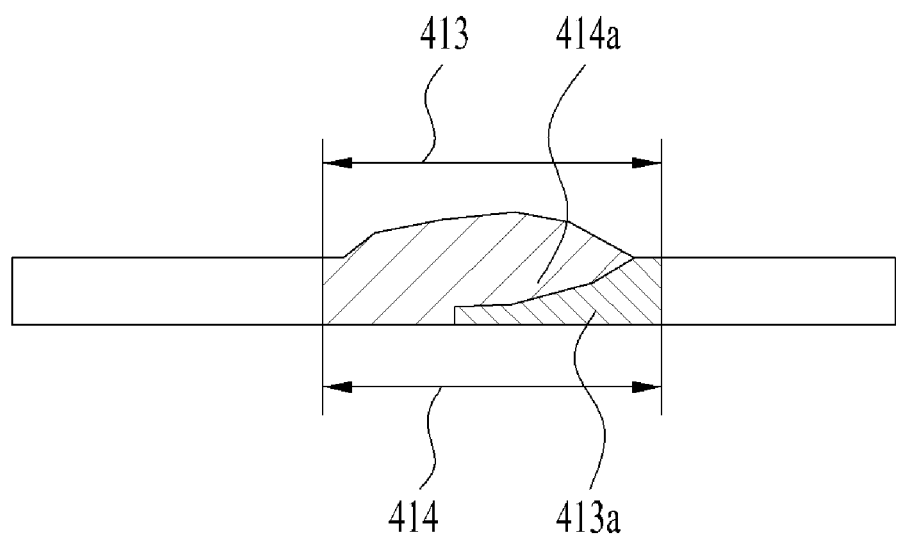
FIGS. 6A and 6B are cross-sectional diagrams illustrating pattern overlap portions of the related art and the present invention, respectively.
Figure 6B:
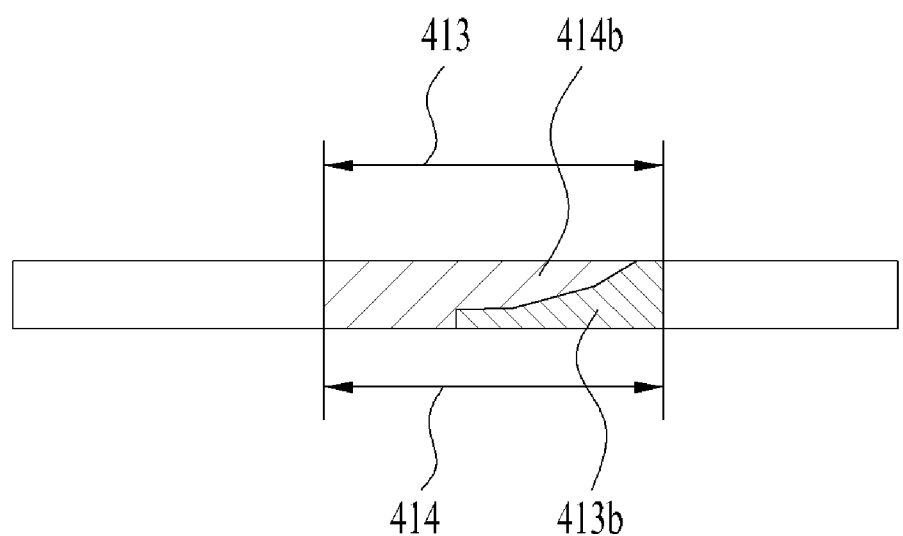

FIGS. 6A and 6B are cross-sectional diagrams illustrating pattern overlap portions of the related art and the present invention, respectively.

Referring to FIGS. 5 to 6B, a pattern having a closed curve 410 as illustrated here may be formed by varying the ejection amount according to speed of the dispenser and position of the dispenser such as a start portion, an end portion, and a curved portion.

Particularly, the closed curve 410 has a start portion 413 where coating is initiated, a straight portion 411 formed in a straight line, a curved portion 412 where the pattern is bent, and an end portion 414 where the pattern ends.

In such pattern formation, a thickness and line-width of the pattern may be determined according to the user. For example, the closed curve 410 having a uniform thickness and line-width will be exemplarily described with reference to FIGS. 5 to 6B. In addition, a pattern formed using a nozzle hole group 333 including a micro nozzle hole group 333x ejecting a smaller amount and a normal nozzle hole group 333y ejecting a larger amount will be described.

Pressure is applied by the pressing unit 321 to initiate pattern formation, and one of the plurality of nozzle hole groups 333 is selectively opened by the opening slit 361 of the syringe cap 360. Accordingly, ejection and coating of the raw material is initiated at the start portion. In this regard, even when pressure is applied to the start portion 413 from a pressing unit 321, it takes some time to uniformly perform coating of the raw material. Accordingly, the open slit 361 of the syringe cap 360 is disposed at the normal nozzle hole group 333y to open the normal nozzle hole group 333y. Then, ejection is performed by use of the normal nozzle hole group 333y at the next straight portion 411. In this regard, the dispenser 300 performs coating at a constant speed to form the straight portion 411 having constant thickness and line-width.

Since the speed of the dispenser 300 decreases at the curved portion 412, the thickness or line-width of the curved portion 412 may be greater than those of the straight portion 411 when coating is performed using the normal nozzle hole group 333y. Accordingly, the syringe cap 360 is rotated by the cap-driving unit 323 at the curved portion 412, such that the open slit 361 closes the normal nozzle hole group 333y and opens the micro nozzle hole group 333x for coating of the raw material. Accordingly, the amount of the raw material decreases in response to reduction in speed of the dispenser 300. At a subsequent straight portion 411, the normal nozzle hole group 333y is selected to form the straight portion 411.

The closed curve 410 pattern is formed by forming the straight portion 411 and the curved portion 412. At the last stage, the end portion 414 which overlaps the start portion 413 is formed to complete formation of the closed curve 410 pattern.

FIGS. 6A and 6B illustrates a side of the overlapped portion. When the start portion 413a overlaps the end portion 414a while performing ejection of the raw material, the thickness of the overlap portion is greater than the other portions as illustrated in FIG. 6A.

Thus, according to the present invention, the ejection of the raw material is ceased at a start point of the end portion 414 where the overlapping is initiated. Instead, only the raw material remaining at the nozzle surface 313 is coated at the overlapped portion. As a result, the thickness of the overlapped portion may be the same as the other portions as illustrated in FIG. 6B. To this ends, the cap-driving unit 313 rotates the syringe cap 360 to overlap the open slit 361 and the second region 332 when the dispenser enters the end portion 414, thereby closing all of the nozzle holes 334.

As described above, a desired pattern may be efficiently formed using the dispenser according to the present invention by controlling opening and closing of the nozzle holes 334 and the ejection amount of the raw material according to the operation of the dispenser.

Figure 7:
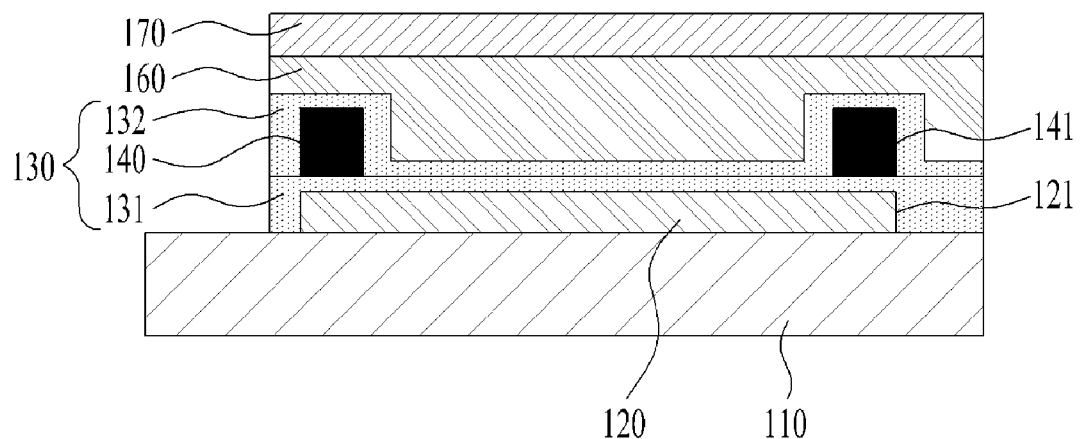
FIG. 7 is a cross-sectional view schematically illustrating an organic light emitting display device according to an embodiment of the present invention.

FIG. 7 is a cross-sectional view schematically illustrating an organic light emitting display device according to the present invention.

Figure 8:
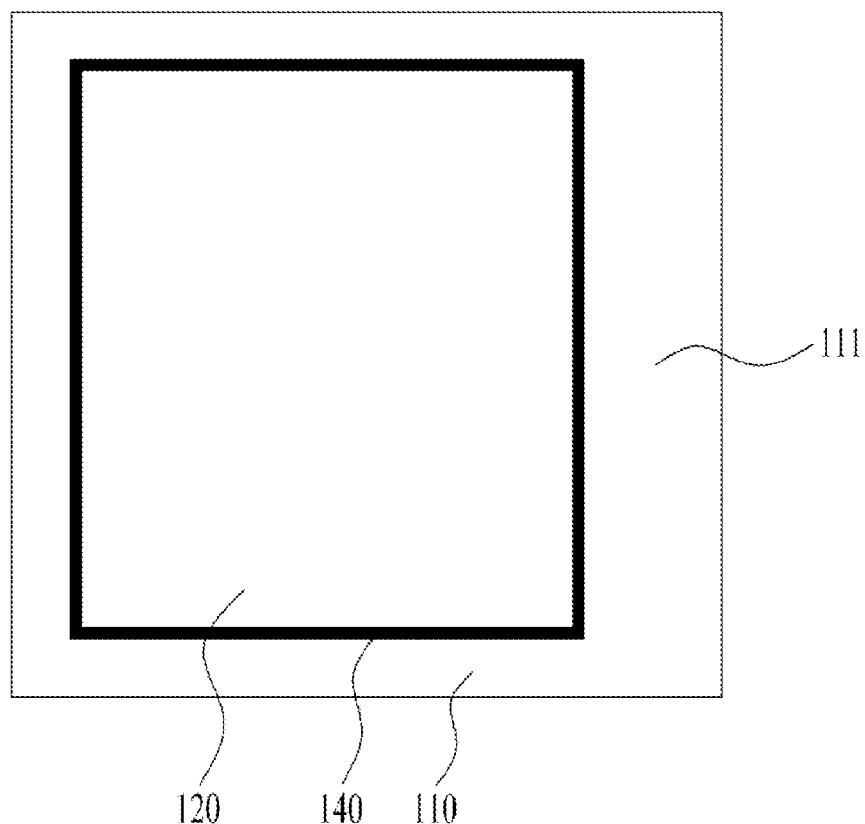
FIG. 8 is a plan view schematically illustrating the organic light emitting display device according to an embodiment of the present invention.

FIG. 8 is a plan view schematically illustrating the organic light emitting display device according to the present invention.

Referring to FIGS. 7 and 8, the organic light emitting display device according to the present invention includes a substrate 110, an organic light emitting device 120, a multi-protective layer 130, a sealing material layer 160, and a seal cap 170. The multi-protective layer 130 includes a first protective layer 131, a second protective layer 140, and a third protective layer 132.

Light generated in the organic light emitting device 120 may be emitted via the substrate 110. The multi-protective layer 130 and the sealing material layer 160 are formed on the substrate 110, and the seal cap 170 is mounted to be opposite to the substrate 110. The substrate 110 may be formed of glass, plastic, or a transparent conductive material. A buffer layer may be formed on the substrate 110 using silicon oxide ($SiO_2$), silicon nitride ($SiN_x$), or the like for protection of the organic light emitting device 120 formed during a subsequent operation from impurities such as alkali ions which may leak from the substrate 110.

The organic light emitting device 120 includes an anode (not shown) and a cathode (not shown) opposite to each other and an organic light emitting layer interposed between the anode and the cathode. In addition, the organic light emitting device 120 may be connected to a thin film transistor (not shown) to transfer a signal to the anode or the cathode. One electrode of the anode and the cathode of the organic light emitting device 120 and a thin film transistor are formed on the substrate 110, and the organic light emitting layer is formed over the substrate 110 provided with the electrode. The organic light emitting layer may include a hole injection layer (not shown), a hole transport layer (not shown), a light emitting layer (not shown), an electron transport layer (not shown), an electron injection layer (not shown), and a buffer layer (not shown).

The multi-protective layer 130 protects the organic light emitting device 120 from deterioration and damage by preventing moisture from entering the organic light emitting device 120 via blocking external air. To this end, the multi-protective layer 130 includes the first protective layer 131, the second protective layer 140, and the third protective layer 132.

The first protective layer 131 is formed on the substrate and the organic light emitting device 120 using an inorganic material so as to cover a portion of the substrate 110 and the entire surface of the organic light emitting device 120. The first protective layer 131 is formed by deposition such as chemical vapor deposition (CVD), sputtering, evaporation, or the like. The first protective layer 131 may be formed of one compound selected from the group consisting of silicon oxide ($SiO_x$), silicon nitride ($SiN_x$), SiC, SiON, SiOC, SiONC, and equivalents thereof.

The third protective layer 132 is also formed of an inorganic material as the first protective layer 131. The third protective layer 132 is formed on the first protective layer 131 and the second protective layer 140 to cover the second protective layer 140 and portions of the first protective layer 131 which are not covered by the second protective layer 140. The third protective layer 132 is also formed by deposition, sputtering, evaporation, or the like using an inorganic material in the same manner as the first protective layer 131. The third protective layer 132 may be formed of one compound selected from the group consisting of $SiO_x$, $SiN_x$, SiC, SiON, SiOC, SiONC, and equivalents thereof as the first protective layer 131.

The second protective layer 140 is formed of an organic material differently from the first and third protective layers 131 and 132. Particularly, the second protective layer 140 is formed as a closed curve having a uniform line-width differently from the first and third protective layers 131 and 132, which are formed as films covering the entire surface. That is, as illustrated in FIG. 2, the second protective layer 140 is formed on the first protective layer 131 along the edges of the organic light emitting device 110 in a frame-like shape. The second protective layer 140 has a greater, for example, about 20 times greater, thickness than those of the first and third protective layers 131 and 132 formed of inorganic materials. In particular, the second protective layer 140 may have a thickness of about 5 to 10 but the present invention is not limited thereto.

An outer edge 141 of the second protective layer 140 is aligned to correspond to an outer edge 121 of the organic light emitting device 120, but a gap may be formed therebetween. In addition, the line-width W of the second protective layer 140, which is designed by a user, may be in the range of several to several tens of μm but the line-width W may vary according to an area of the organic light emitting device 120. The second protective layer 140 compensates for the height difference of the multi-protective layer 130 caused by particles generated during formation of the first and third protective layers 131 and 132 or impurities adsorbed to the first and third protective layers 131 and 132 during the process and protects the organic light emitting device 120 from moisture.

The second protective layer 140 is formed by printing, coating by use of a dispenser, or the like. To this end, the second protective layer 140 initiates coating at a point corresponding to an edge of the organic light emitting device 120, continues the coating along the edges, and ends the coating while overlapping the start point of the second protective layer 140. Accordingly, a closed curve frame or a rectangular frame is formed along the edges of the organic light emitting device 120 by the second protective layer 140. Particularly, in order to prevent increase in the thickness of the overlapped region of the second protective layer 140, the end portion of the second protective layer 140 is disposed at a central region of the organic light emitting device 120, i.e., inside the closed curve. The second protective layer 140 may be formed of acrylate, epoxy-based polymers, imide-based polymers, or equivalents thereof, but the present invention is not limited thereto. This will be described in more detail with reference to the following drawings.

The sealing material layer 160 is formed on the third protective layer 132. The sealing material layer 160 is formed over the entire surface of the third protective layer 132 for close contact between the multi-protective layer 130 and the seal cap 170.

The seal cap 170 is disposed over the sealing material layer 160 and bonded to the organic light emitting device 120 via the sealing material layer 160 to physically protect the organic light emitting device 120. The seal cap 170 may be formed of glass, plastic, or metal, but the present invention is not limited thereto.

FIG. 9 is a flowchart illustrating a method of fabricating the organic light emitting display device according to the present invention.

Referring to FIG. 9, the method of fabricating an organic light emitting display device includes preparing a substrate (S10), forming a device (S20), forming a first protective layer (S30), forming a second protective layer (S40), forming a third protective layer (S50), forming a sealing material layer (S60), and aligning a seal cap (S70).

The substrate preparation operation (S10) is an operation of preparing a substrate 110 to form an organic light emitting device 120. A buffer layer may be formed on the substrate 110 in the substrate preparation operation (S10), but the present invention is not limited thereto. In addition, various electrodes may be formed on the substrate 110 during the substrate preparation operation (S10).

The device formation operation (S20) is an operation of forming an organic light emitting device 120 on the substrate 110. During the device formation operation (S20), an anode, circuits such as transistors, a hole injection layer, a hole transport layer, a light emitting layer, an electron transport layer, an electron injection layer, and a cathode are formed on the substrate 110.

During the first protective layer formation operation (S30), a first protective layer 131 is formed on the organic light emitting device 120 and the substrate 110 to cover the organic light emitting device 120 formed during the device forming apparatus (S20) and a portion of the substrate 110.

The second protective layer formation operation (S40) is an operation of forming a second protective layer 140 on the first protective layer 131 that is formed during the first protective layer formation operation (S30). As described above, the second protective layer 140 is formed in a closed curve frame along the edges of the organic light emitting device 120.

During the third protective layer formation operation (S40), a third protective layer 132 is formed on the second protective layer 140 and a portion of the first protective layer 131 which is not covered by the second protective layer 140.

During the sealing material layer formation operation (S50), a sealing material layer 160 is formed by coating a sealing material on the third protective layer 132.

The seal cap alignment operation (S60) is an operation of aligning and bonding the seal cap 170 to the sealing material layer 160 formed during the sealing material layer formation operation (S50). Accordingly, fabrication of the organic light emitting display device is completed.

FIG. 10 is a flowchart illustrating a method of forming the second protective layer (S20) in more detail as shown in FIG. 9.

Referring to FIG. 10, the second protective layer formation operation includes initiating coating (S41), forming a straight portion (S42), forming a curved portion (S43), and ending coating (S44).

In the coating initiation operation (S41), the syringe 310 of the dispenser is disposed at a predetermined start portion of the first protective layer 131 to form the second protective layer 140. Then, the cap-driving unit 323 rotates the syringe cap 360 to open one of the nozzle hole groups 331. Simultaneously, the pressing unit 321 presses an organic material to be ejected through the nozzle 324 while the syringe 310 moves above the first protective layer 131 by the transporting unit 322.

The straight portion formation operation (S42) is an operation of forming the second protective layer 140 as the syringe 310 straightly moves along the first protective layer 131 by the transporting unit 322 while maintaining the ejection state. In this regard, when the ejection amount of the nozzle hole group 331 is controlled in three levels or more, a maximum or medium ejection amount is maintained during the coating initiation operation (S41), and the medium ejection amount is maintained during the straight portion formation operation (S42) to form the straight portion.

The curved portion formation operation (S43) is an operation of forming a curved portion between the straight portions. During the curved portion formation operation (S43), the speed of the syringe 310 decreases and the cap-driving unit 323 operates the syringe cap 360, such that another nozzle hole group 331 ejecting a smaller amount than the nozzle hole group used during the straight portion formation operation (S42) is selected and opened. In this regard, the curved portion formation operation (S43) and the straight portion formation operation (S42) may be alternately formed plural times according to the shape of the closed curve.

The coating ending operation (S44) is an operation of ending pattern formation by overlapping the end portion, where the closed curve pattern is ended, and the start portion while forming the second protective layer 140. During the coating ending operation (S44), when the syringe 310 approaches the end portion, the cap-driving unit 323 rotates the syringe cap 360 such that the open slit 361 is disposed at the second region 332 to close all of the nozzle hole groups. The transporting unit 322 moves the syringe 310 above the start portion even after ejection of the organic material is ceased as the nozzle hole group 331 is closed, such that the organic material remaining at the nozzle surface 313 is ejected to the start portion to form the end portion, thereby completing the pattern formation.

As is apparent from the above description, according to the dispenser and the method of fabricating an organic light emitting display device according to the present invention, a uniform material layer may be formed by efficiently controlling an ejection amount through a plurality of nozzles, which have different diameters, are mounted at an injector of the dispenser, and are opened and closed by a cap, and by adjusting the ejection amount in accordance with speed and position of the dispenser.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A dispenser comprising:
   a syringe comprising a nozzle for ejecting the coating material to a substrate and a syringe cap for controlling a coating amount from the nozzle to which a coating material is injected;
   a pressing unit that provides a pressure for ejecting the coating material;
   a transporting unit that moves the syringe above the substrate; and
   a cap-driving unit that rotates the syringe cap with respect to the nozzle to control the coating amount.

2. The dispenser according to claim 1, wherein the nozzle of the syringe has a nozzle surface having a plurality of nozzle hole groups, each comprising at least one nozzle hole.

3. The dispenser according to claim 2, wherein the nozzle surface of the syringe has a first region, in which the plurality of nozzle hole groups are disposed, and a second region adjacent to the first region.

4. The dispenser according to claim 3, wherein the plurality of nozzle hole groups have at least one of different numbers of the nozzle holes, different cross-sectional areas of the nozzle holes, different shapes of the nozzle holes, and different average cross-sectional areas of the nozzle holes.

5. The dispenser according to claim 4, wherein the syringe cap has open slits to selectively open one of the plurality of nozzle hole groups.

6. The dispenser according to claim 5, wherein:
   one of the plurality of nozzle hole groups of the nozzle is opened as the selected open slit and the first region overlap each other by rotation of the syringe cap; and
   the plurality of nozzle hole groups are closed as the open slit and the second region overlap each other.

* * * * *